(12) United States Patent
Lin et al.

(10) Patent No.: US 11,676,758 B2
(45) Date of Patent: Jun. 13, 2023

(54) MAGNETIC DEVICE

(71) Applicant: CYNTEC CO., LTD., Hsinchu (TW)

(72) Inventors: Wenyu Lin, Taipei (TW); TsungHao Lu, Hsinchu (TW); Hao Chun Chang, Hsinchu (TW)

(73) Assignee: CYNTEC CO., LTD., Hsinchu (TW)

( * ) Notice: Subject to any disclaimer, the term of this patent is extended or adjusted under 35 U.S.C. 154(b) by 381 days.

(21) Appl. No.: 16/820,918

(22) Filed: Mar. 17, 2020

(65) Prior Publication Data
US 2020/0303112 A1    Sep. 24, 2020

Related U.S. Application Data

(60) Provisional application No. 62/822,048, filed on Mar. 22, 2019.

(51) Int. Cl.
| | |
|---|---|
| *H01F 27/22* | (2006.01) |
| *H01F 27/32* | (2006.01) |
| *H01F 27/29* | (2006.01) |
| *H01F 27/28* | (2006.01) |
| *H01F 27/24* | (2006.01) |
| *H01F 27/02* | (2006.01) |
| *H05K 1/18* | (2006.01) |
| *H01L 25/07* | (2006.01) |

(52) U.S. Cl.
CPC .......... *H01F 27/327* (2013.01); *H01F 27/022* (2013.01); *H01F 27/22* (2013.01); *H01F 27/24* (2013.01); *H01F 27/2823* (2013.01); *H01F 27/2852* (2013.01); *H01F 27/29* (2013.01); *H05K 1/18* (2013.01); *H01L 25/072* (2013.01); *H05K 2201/1003* (2013.01); *H05K 2201/10166* (2013.01); *H05K 2201/10515* (2013.01)

(58) Field of Classification Search
CPC .......... H01F 17/00; H01F 17/04; H01F 27/02; H01F 27/022; H01F 27/22; H01F 27/24; H01F 27/2823; H01F 27/327; H01F 27/283; H01F 27/306; H05K 1/18; H05K 1/181–187
USPC ................. 361/782–784, 268; 336/216–233, 336/192–200
See application file for complete search history.

(56) References Cited

U.S. PATENT DOCUMENTS

| | | | | |
|---|---|---|---|---|
| 6,154,112 A | * | 11/2000 | Aoba | H01F 27/292 336/200 |
| 6,393,691 B1 | * | 5/2002 | Ogawa | H01F 17/045 336/200 |
| 7,164,337 B1 | * | 1/2007 | Furia | E05C 17/56 335/280 |
| 7,786,832 B2 | * | 8/2010 | Lin | H01F 27/027 336/200 |
| 7,898,375 B2 | * | 3/2011 | Kitajima | H01F 17/045 336/200 |

(Continued)

*Primary Examiner* — Tuan T Dinh
(74) *Attorney, Agent, or Firm* — Min-Lee Teng

(57) ABSTRACT

A magnetic device comprising a magnetic body, a coil disposed in the magnetic body and at least one thermal conductive layer, wherein a first portion of the at least one thermal conductive layer encapsulates at least one portion of the coil and a second portion of the at least one thermal conductive layer is exposed from the magnetic body, wherein the at least one thermal conductive layer forms a continuous thermal conductive path from the coil to the outside of the magnetic body for dissipating heat generated from the coil.

5 Claims, 17 Drawing Sheets

(56) References Cited

U.S. PATENT DOCUMENTS

| | | | |
|---|---|---|---|
| 9,431,166 B2* | 8/2016 | Shijo | H01F 27/34 |
| 2010/0301981 A1* | 12/2010 | Zeng | H01F 27/2885 |
| | | | 336/105 |
| 2011/0198955 A1* | 8/2011 | Platon | H02K 5/08 |
| | | | 29/605 |
| 2015/0357111 A1* | 12/2015 | Sasaki | H01F 5/04 |
| | | | 29/605 |
| 2017/0004916 A1* | 1/2017 | Shijo | H01F 27/02 |

* cited by examiner

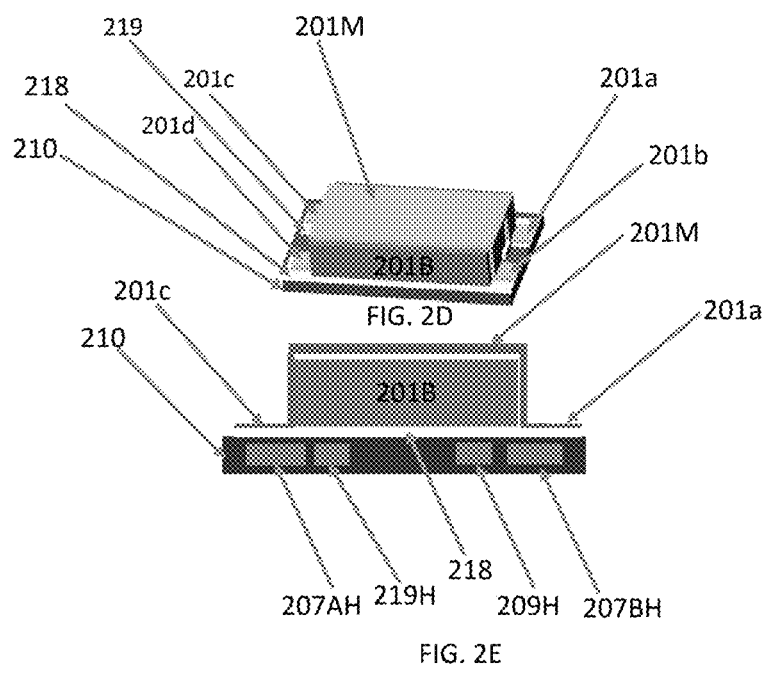

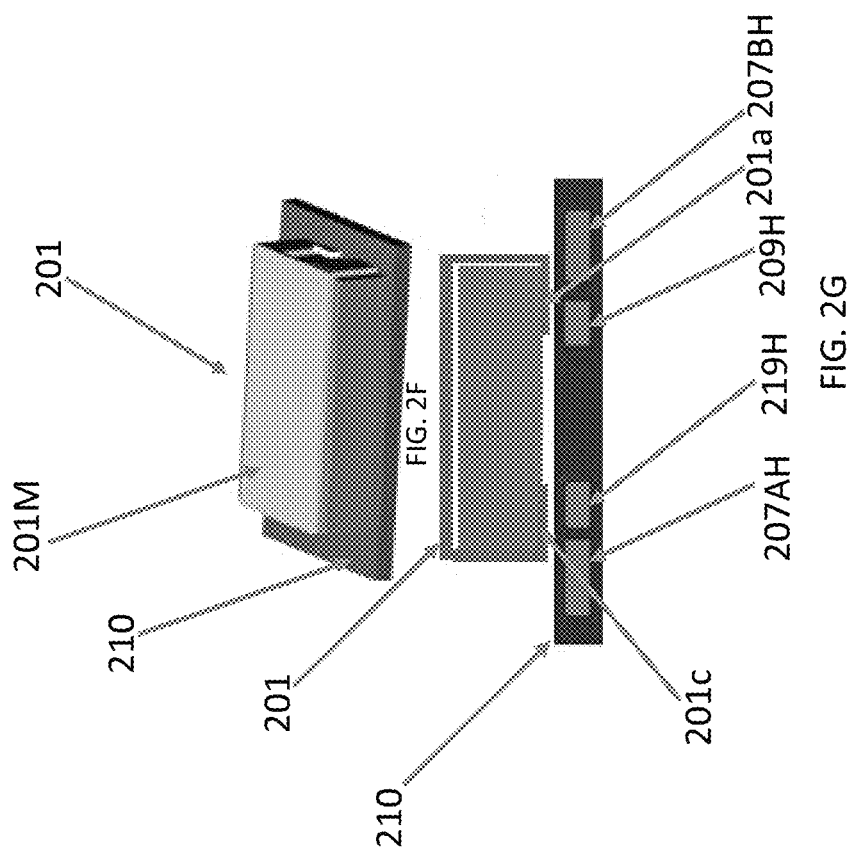

| Types of Heat Dissipation Structure | | | Thermal Resistance | | | | | | | | |
|---|---|---|---|---|---|---|---|---|---|---|---|
| | | | | MC8-1 | MC8-2 | MC8-3 | MC8-4 | MC8-5 | Rav1 | Rav2 | Iradiate |
| 214 | 214A | | 9.83 | 12.87 | 11.37 | 11.20 | 10.01 | 8.87 | 11.22 | 12.03 | 2.06 |
| | 214B | | 6.92 | 8.71 | 8.10 | 8.02 | 6.87 | 5.77 | 7.95 | 8.63 | 1.69 |
| | 214C | | 7.02 | 8.67 | 8.03 | 8.17 | 6.92 | 5.75 | 8.22 | 8.91 | 1.69 |
| | 214D | | 4.30 | 6.57 | 6.10 | 5.28 | 4.99 | 4.01 | 5.84 | 6.08 | 1.38 |
| 215 | 215A | | 9.45 | 11.07 | 10.51 | 10.37 | 9.60 | 8.66 | 10.72 | 11.07 | 2.07 |
| | 215B | | 4.48 | 6.07 | 5.78 | 5.28 | 4.74 | 3.91 | 5.71 | 5.93 | 1.47 |
| | 215C | | 4.84 | 6.39 | 6.08 | 5.65 | 5.05 | 4.20 | 6.06 | 6.30 | 1.46 |
| | 215D | | 3.00 | 4.84 | 4.59 | 3.85 | 3.61 | 2.79 | 4.50 | 4.58 | 1.34 |

Fig. 4

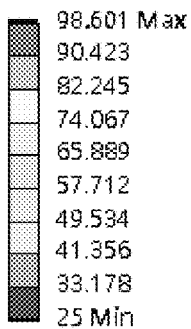
FIG. 7C
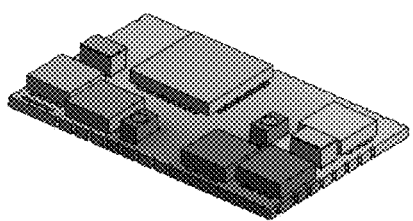
FIG. 7A
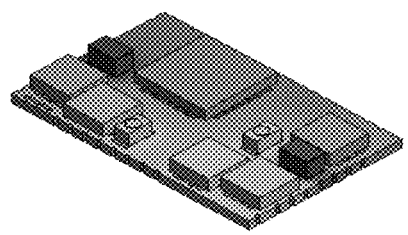
FIG. 7B
| Total Loss (W) | Max Temp(°C) | Rth (K/W) | |
|---|---|---|---|
| 3.28 | 98.601 | 22.439 | Without heat sink |
| 3.28 | 52.925 | 8.514 | With heat ink of present invention |
FIG. 7D

MAGNETIC DEVICE

CROSS-REFERENCES TO RELATED APPLICATIONS

The present application claims the benefit of U.S. Provisional Application Ser. No. 62/822,048 filed on Mar. 22, 2019, which is hereby incorporated by reference herein and made a part of the specification.

BACKGROUND OF THE INVENTION

I. Field of the Invention

The invention relates to an electronic structure and, in particular, to a stacked electronic structure.

II. Description of the Related Art

Electronic structures, such as power modules and DC-DC converters, typically include electronic devices having interconnecting circuitry electrically connected to a substrate. The devices are coupled to leads for connection to conductive patterns and/or other electronic assemblies.

One conventional approach for reducing the surface area occupied by the electronic structures in compact electronic products is to stack the assembled devices. However, the heat generated from the coil is hard to dissipate.

Furthermore, the heat generated by the stacked electronic devices is also hard to dissipate.

Accordingly, there is demand for a better solution to solve these problems.

SUMMARY OF THE INVENTION

In one embodiment of the present invention, a magnetic device is disclosed, wherein the magnetic device comprises a magnetic body, a coil disposed in the magnetic body and at least one thermal conductive layer, wherein a first portion of the at least one thermal conductive layer encapsulates at least one portion of the coil and a second portion of the at least one thermal conductive layer is exposed from the magnetic body, wherein the at least one thermal conductive layer forms a continuous thermal conductive path from the coil to the outside of the magnetic body for dissipating heat generated from the coil.

In one embodiment, the at least one thermal conductive layer comprises a thermal conductive and adhesive layer encapsulates an inner surface of the coil.

In one embodiment, the thermal conductive and adhesive layer further encapsulates an outer surface of the coil.

In one embodiment, the at least one thermal conductive layer comprises a thermal conductive and adhesive layer and a metal layer, wherein a first portion of the thermal conductive and adhesive layer encapsulates an inner surface of the coil and a second portion of the thermal conductive and adhesive layer is disposed over a top surface or a bottom surface of the coil, wherein the thermal conductive and adhesive layer adheres the coil to a corresponding portion of the magnetic body, and the metal layer is overlaid on the second portion of the thermal conductive and adhesive layer and extended to an outer surface of the magnetic body for dissipating heat generated from the coil.

In one embodiment, the at least one thermal conductive layer comprises a thermal conductive and adhesive layer, a first metal layer and a second metal layer, wherein a first portion of the thermal conductive and adhesive layer encapsulates an inner surface of the coil, a second portion of the thermal conductive and adhesive layer is disposed over a top surface of the coil, and a third portion of the thermal conductive and adhesive layer is disposed over a bottom surface of the coil, wherein the first metal layer is overlaid on the second portion, and the second metal layer is overlaid on the third portion of the thermal conductive and adhesive layer, wherein each of the first metal layer and the second metal layer is extended to a corresponding outer surface of the magnetic body for dissipating heat generated from the coil.

In one embodiment, the magnetic device is an inductor.

In one embodiment, the magnetic device is a choke.

In one embodiment, each of the at least one thermal conductive layer has a thermal conductivity: K>0.5 W/mK.

In one embodiment, the thermal conductive layer comprises at least one of the following material: copper foil, thermal paste, thermal glue, thermal tape, copper pillar, graphite, and etc.

In one embodiment, the at least one thermal conductive layer comprises a first thermal conductive layer comprising thermal conductive and adhesive material that is disposed between said inner surface of the coil and a portion of the magnetic body disposed in the hollow space of the coil.

In one embodiment, the at least one thermal conductive layer further comprises a second thermal conductive layer comprising metal that is disposed between a bottom surface of the coil and a portion of the magnetic body disposed under said bottom surface of the coil, wherein the second thermal conductive layer extends to an outer surface of the magnetic body.

In one embodiment, the magnetic body comprises an I core, wherein a portion of the at least one thermal conductive layer is disposed between said inner surface of the coil and the pillar of the I core.

In one embodiment, the magnetic body comprises a T core, wherein a portion of the at least one thermal conductive layer is disposed between said inner surface of the coil and the pillar of the T core.

In one embodiment, a stacked electronic structure is disclosed, wherein the stacked electronic structure comprises: a substrate, wherein a plurality of electronic devices are disposed on and electrically connected to the substrate, wherein a molding body encapsulates the plurality of electronic devices, a first thermal conductive layer is disposed on a first electronic device and a second thermal conductive layer is disposed on a second electronic device, wherein the first thermal conductive layer and the second thermal conductive layer are separated by a gap; and a magnetic device, comprising a magnetic body disposed over a top surface of the molding body, wherein at least one third thermal conductive layer encapsulates the magnetic body, wherein the at least one third thermal conductive layer comprises a first terminal portion and a second terminal portion, wherein the first terminal portion and the second terminal portion are separated by a gap, and the first thermal conductive layer and the second thermal conductive layer are respectively connected with the first terminal portion and the second terminal portion for heat dissipation.

In one embodiment, the at least one third thermal conductive layer comprises a third metal layer that encapsulates the top surface of the magnetic body and extends to the first terminal portion and the second terminal portion through a first lateral surface.

In one embodiment, the at least one third thermal conductive layer comprises a third metal layer that encapsulates the top surface of the magnetic body and extends to the first terminal portion through a first lateral surface and the second terminal portion through a second lateral surface opposite to the first lateral surface.

In one embodiment, the third metal layer extends to a third terminal portion and a fourth terminal portion through a second lateral surface opposite to the first lateral surface.

In one embodiment, the first terminal portion of the third metal layer is extended to a first portion of the bottom surface of the magnetic body, and the second terminal portion of the third metal layer is extended to a second portion of the bottom surface of the magnetic body, wherein the first terminal portion and the second terminal portion are electrically connected to the first metal layer and the second metal layer, respectively.

In one embodiment, the at least one third thermal conductive layer comprises a third metal layer and a fourth metal layer, wherein the third metal layer and the fourth metal layer are separated by a gap, wherein the third metal layer encapsulates a first portion of the top surface of the magnetic body and extends to the first terminal portion through a first lateral surface, and the fourth metal layer encapsulates a second portion of the top surface of the magnetic body and extends to the second terminal portion through the first lateral surface.

In one embodiment, the third metal layer extends to a third terminal portion through a second lateral surface opposite to the first lateral surface, and the fourth metal layer extends to a fourth terminal portion through the second lateral surface.

In one embodiment, the first metal layer and the second metal layer are respectively in contact with the first terminal portion and the second terminal portion for heat dissipation. In one embodiment, wherein each of said metal layer is electrically connected to a ground.

In one embodiment, wherein the first metal layer encapsulates a top surface of the first electronic device.

In one embodiment, wherein the first metal layer encapsulates a top surface and a plurality of lateral surfaces of the first electronic device.

In one embodiment, wherein the second metal layer encapsulate a top surface of the second electronic device.

In one embodiment, wherein the second metal layer encapsulate a top surface and a plurality of lateral surfaces of the second electronic device.

In one embodiment, wherein each of the first electronic device and the second electronic device is a MOSFET.

In one embodiment, the first electrode of the magnetic device is electrically connected to a first conductive pillar disposed on the substrate.

In one embodiment, a second electrode of the magnetic device is electrically connected to a second conductive pillar disposed on the substrate.

In one embodiment, the plurality of electronic devices comprises an IC and a MOSFET.

In one embodiment, the molding body further encapsulates the conductive pillars with a top surface of each of the conductive pillars exposed from the molding body.

BRIEF DESCRIPTION OF THE DRAWINGS

The present invention can be more fully understood by reading the subsequent description and examples with references made to the accompanying drawings, wherein:

FIG. 2B-2C is a partially schematic of a stacked electronic structure in accordance with one embodiment of the invention;

FIG. 2D-2E is a partially schematic of a stacked electronic structure in accordance with one embodiment of the invention;

FIG. 2F-2G is a partially schematic of a stacked electronic structure in accordance with one embodiment of the invention;

FIG. 4 shows a comparison of thermal resistances of some of the stacked electronic module of the present invention to the conventional technology.

FIG. 7A-7D shows heat simulation results of the module in accordance with an embodiment of the invention.

DETAILED DESCRIPTION OF THE INVENTION

Figure 1A:
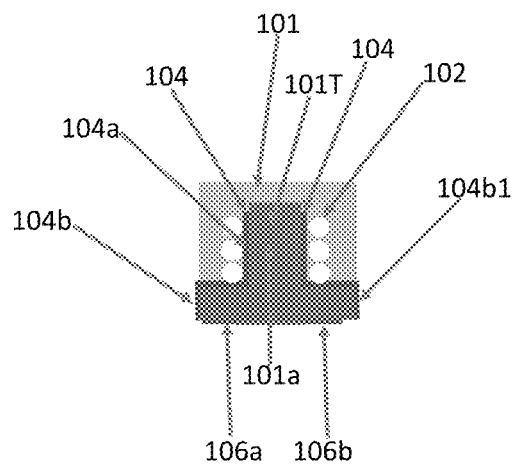
FIG. 1A-1D each shows a partially schematic, cross-sectional side view of a magnetic device in accordance with a corresponding embodiment of the invention.

It is understood that the following disclosure provides many different embodiments, or examples, for implementing different features of the invention. Specific examples of devices and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features are formed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A is a partially schematic, cross-sectional side view of a magnetic device in accordance with one embodiment of the invention. As shown in FIG. 1A, wherein an magnetic device comprises a magnetic body 101, a coil 102 disposed in the magnetic body 101, and a first thermal conductive layer 104, wherein a first portion 104a of the first thermal conductive layer 104 is disposed between an inner surface of the coil and a first portion 101a of the magnetic body 101 disposed in the hollow space of the coil 102, and a second portion 104b of the first thermal conductive layer 104 is exposed from the magnetic body 101 to dissipate heat generated from the coil 102.

In one embodiment, the magnetic body 101 comprises a T core 101T, wherein the first portion 104a of the first thermal conductive layer 104 is disposed between the inner surface of the coil 102 and the pillar 101a of the T core 101T, wherein the second portion 104b of the first thermal conductive layer 104 is disposed on an outer surface of the of the T core 101T to dissipate heat from the coil.

In one embodiment, a third portion 104b1 of the first thermal conductive layer 104 is disposed on an outer surface of the T core 101T to dissipate heat from the coil.

In one embodiment, the magnetic device is an inductor.

In one embodiment, the magnetic device is a choke.

In one embodiment, the first thermal conductive layer 104 has a thermal conductivity: K>0.5 W/mK.

In one embodiment, the coverage of the coil by the first thermal conductive layer 104 is 5~100%.

In one embodiment, the first thermal conductive layer 104 comprises at least one of the following material: copper foil, thermal paste, thermal glue, thermal tape, copper pillar, graphite, and etc.

In one embodiment, the first thermal conductive layer 104 comprises thermal conductive and adhesive material to be adhered to the coil.

In one embodiment, the first thermal conductive layer 104 extends to an outer surface of the magnetic body.

Figure 1B:
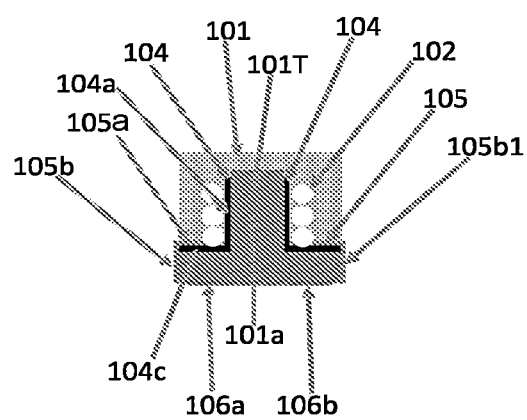

FIG. 1B is a partially schematic, cross-sectional side view of a magnetic device in accordance with one embodiment of the invention. As shown in FIG. 1B, wherein an magnetic device comprises a magnetic body 101, a coil 102 disposed in the magnetic body 101, and a first thermal conductive layer 104, wherein a first portion 104a of the first thermal conductive layer 104 is disposed between an inner surface of the coil and a first portion 101a of the magnetic body 101 disposed in the hollow space of the coil 102, wherein a first portion 105a of a second thermal conductive layer 105 is disposed on a corresponding portion 104c of the first thermal conductive layer 104 and a second portion 105b of the second thermal conductive layer 105 extends to an outer surface of the magnetic body 101, wherein the first thermal conductive layer 104 and the second thermal conductive 105 forms a continuous thermal conductive path to dissipate heat generated from the coil 102.

In one embodiment, the magnetic body comprises a T core 101T, wherein the first portion 104a of the first thermal conductive layer 104 is disposed between the inner surface of the coil 102 and the pillar 101a of the T core 101T, wherein the second portion 105b of the second thermal conductive layer 105 is disposed on an outer surface of the T core 101T.

In one embodiment, a third portion 105b1 of the second thermal conductive layer 105 is disposed on an outer surface of the T core 101T to dissipate heat from the coil.

In one embodiment, the second thermal conductive layer 105 comprises at least one of the following material: copper foil, thermal paste, thermal glue, thermal tape, copper pillar, graphite, and etc.

In one embodiment, the second thermal conductive layer 105 has a thermal conductivity: K>0.5 W/mK.

Figure 1C:
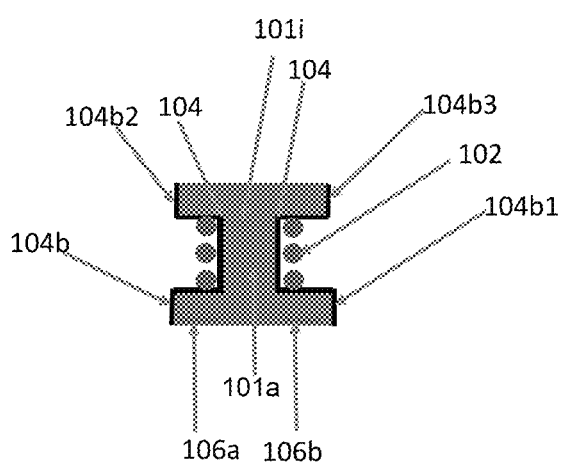
Figure 1D:
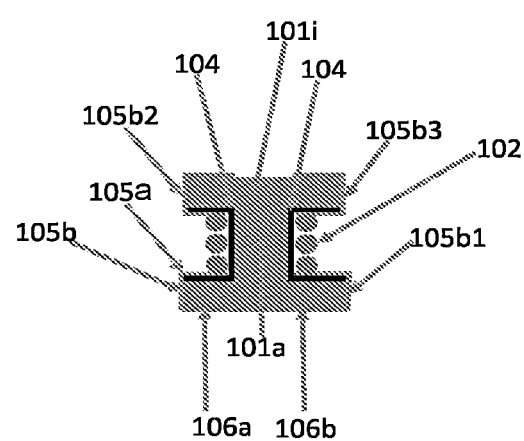

In one embodiment, the magnetic body 101 comprises a I core, as shown in FIG. 1C and FIG. 1D, which are described in below.

FIG. 1C is a partially schematic, cross-sectional side view of a magnetic device in accordance with one embodiment of the invention. As shown in FIG. 1C, wherein an magnetic device comprises a magnetic body 101, a coil 102 disposed in the magnetic body 101, and a first thermal conductive layer 104, wherein a first portion 104a of the first thermal conductive layer 104 is disposed between an inner surface of the coil and a first portion 101a of the magnetic body 101 disposed in the hollow space of the coil 102 and a second portion 104b of the first thermal conductive layer 104 is exposed from the magnetic body 101 to dissipate heat generated from the coil 102.

In one embodiment, the magnetic body 101 comprises a I core 101i, as shown in FIG. 1C, wherein the first portion 104a of the first thermal conductive layer 104 is disposed between the inner surface of the coil 102 and the pillar 101a of the I core 101i, wherein the second portion 104b of the first thermal conductive layer 104 is disposed on an outer surface of the of the I core 101i.

In one embodiment, a third portion 104b1 of the first thermal conductive layer 104 is disposed on an outer surface of the I core 101i to dissipate heat from the coil.

In one embodiment, a fourth portion 104b2 of the first thermal conductive layer 104 is disposed on an outer surface of the I core 101i to dissipate heat from the coil.

In one embodiment, a fifth portion 104b3 of the first thermal conductive layer 104 is disposed on an outer surface of the I core 101i to dissipate heat from the coil.

FIG. 1D is a partially schematic, cross-sectional side view of a magnetic device 100 in accordance with one embodiment of the invention. As shown in FIG. 1D, wherein an magnetic device comprises a magnetic body 101, a coil 102 disposed in the magnetic body 101, and a first thermal conductive layer 104, wherein a first portion 104a of the first thermal conductive layer is disposed between an inner surface of the coil 102 and a first portion 101a of the magnetic body 101 disposed in the hollow space of the coil 102, wherein a first portion 105a of a second thermal conductive layer 105 is disposed on the first thermal conductive layer 104 and a second portion 105b of the second thermal conductive layer 105 extends to an outer surface of the magnetic body 101, wherein the first thermal conductive layer 104 and the second thermal conductive 105 forms a continuous thermal conductive path to dissipate heat generated from the coil 102.

In one embodiment, as shown in FIG. 1D, the magnetic body 101 comprises a I core 101i, wherein the first portion 104a of the first thermal conductive layer 104 is disposed between the inner surface of the coil 102 and the pillar 101a of the I core 101i, wherein the second portion 105b of the second thermal conductive layer 105 is disposed on an outer surface of the of the I core 101i.

In one embodiment, a third portion 105b1 of the second thermal conductive layer 105 is disposed on an outer surface of the I core 101i to dissipate heat from the coil.

In one embodiment, a fourth portion 105b2 of the second thermal conductive layer 105 is disposed on an outer surface of the I core 101i to dissipate heat from the coil.

In one embodiment, a fifth portion 105b3 of the second thermal conductive layer 105 is disposed on an outer surface of the I core 101i to dissipate heat from the coil.

Please note that there are many ways to form the magnetic body 101, for example, the magnetic body 101 can comprise a T core and a magnetic material encapsulating the coil and the T core, or the magnetic body 101 can comprise an I core and a magnetic material encapsulating the coil and the I core, or the entire magnetic body 101 can be integrally formed, that is, the material encapsulating the coil also fills into the hollow space of the coil.

Please note that there are many ways to encapsulate at least one portion of the coil. For example, the thermal conductive layer can encapsulate an inner surface of the coil, or the thermal conductive layer can encapsulate an outer surface of the coil, or the thermal conductive layer can encapsulate an inner surface of the coil and an outer surface of the coil.

In one embodiment, the thermal conductive layer can encapsulate the entire surface of the coil for heat dissipation.

Figure 1E:
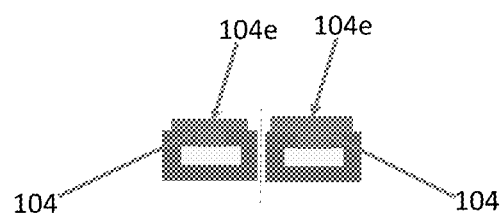
FIG. 1E-1F is a partially schematic, cross-sectional side view of a coil encapsulated by a thermal conductive layer in accordance with another embodiment of the invention.

In one embodiment, as shown in FIG. 1E, the first thermal conductive layer 104 comprises a T shape portion that is in contact with the wire forming the coil wherein the terminal portions 104e of the first thermal conductive layer 104 can be used for exposing the first thermal conductive layer 104 from the molding body for heat dissipation.

Figure 1F:
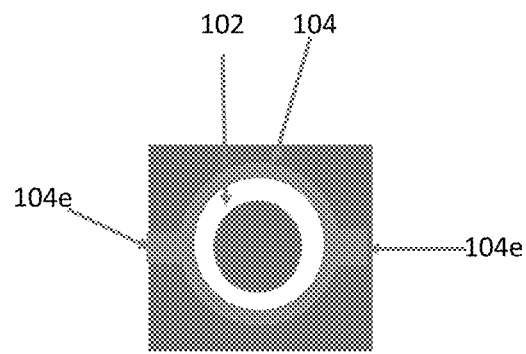

In one embodiment, as shown in FIG. 1F, the first thermal conductive layer 104 comprises a circular shape portion that encapsulates the wire forming the coil, wherein the terminal portions 104e of the first thermal conductive layer 104 can be used for exposing the first thermal conductive layer 104 from the molding body for heat dissipation.

In one embodiment, the coverage of the coil by the thermal conductive layers is 5~100%.

Figure 2A:
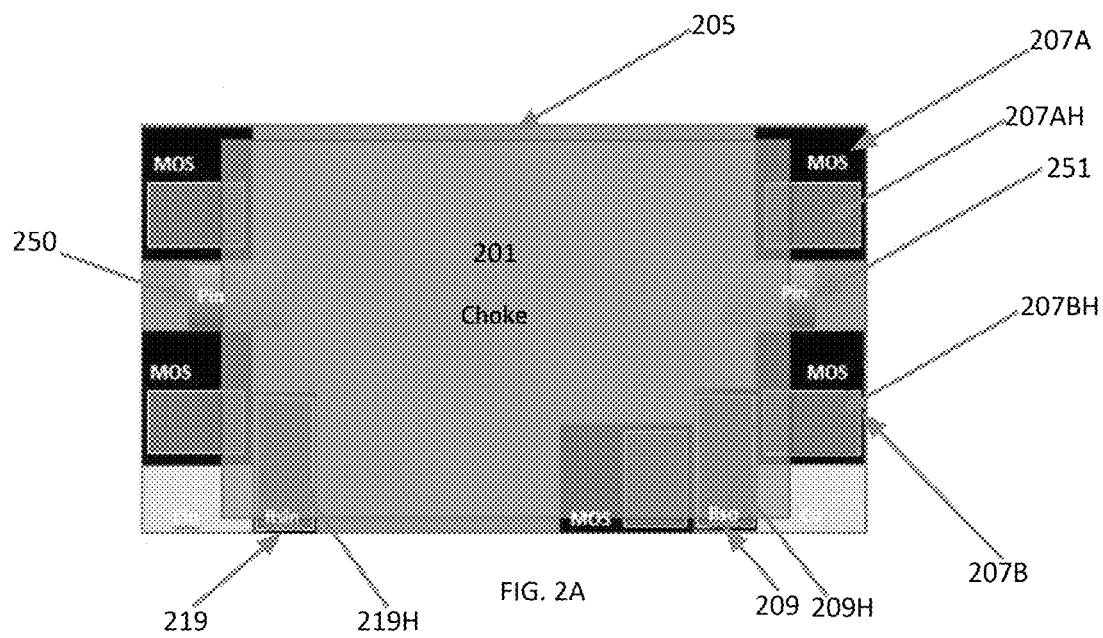
FIG. 2A is a layout of a stacked electronic structure in accordance with one embodiment of the invention.
Figure 2C:
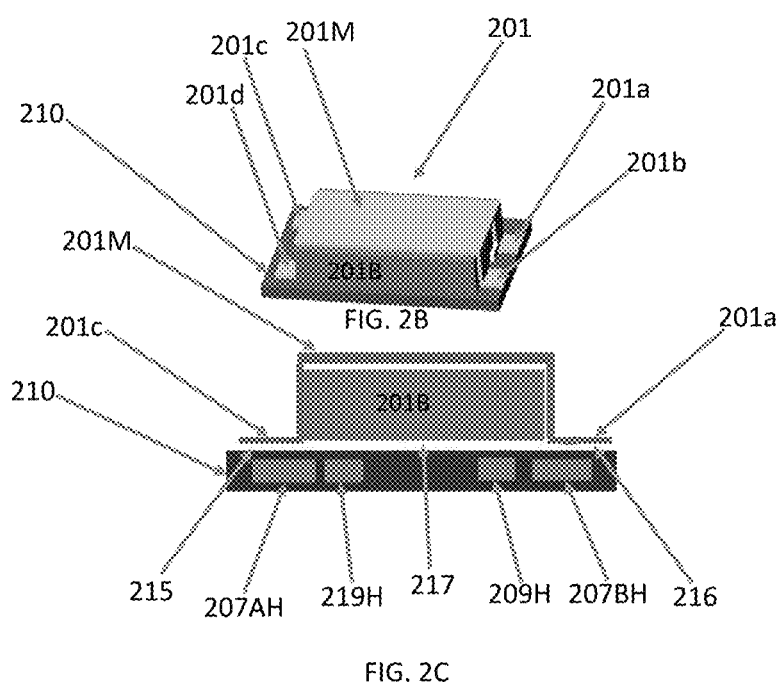

In one embodiment, a stacked electronic structure is disclosed. Please refer to FIG. 2A, FIG. 2B and FIG. 2C, wherein the stacked electronic structure comprises: a substrate 205, a plurality of electronic devices 207A, 207B, 209 disposed on and electrically connected to the substrate 205, wherein a first thermal conductive layer 207AH is disposed on a first electronic device 207A and a second thermal conductive layer 207BH is disposed on a second electronic device 207B, wherein the first thermal conductive layer 207AH and the second thermal conductive layer 207BH are separated by a gap as shown in FIG. 2A, wherein a molding body 210 encapsulates the plurality of electronic devices 207A, 207B, 209, as shown in FIG. 2C in which 207AH and 207BH are shown for illustration purpose; and a magnetic device 201, comprising a magnetic body 201B disposed over a top surface of the molding body 210, wherein a third thermal conductive layer 201M encapsulates the magnetic body 201B, wherein the third thermal conductive layer 201M comprises a first terminal portion 201a and a second terminal portion 201b, wherein the first terminal portion 201a and the second terminal portion 201b are separated by a gap, and the first thermal conductive layer 207AH and the second thermal conductive layer 207BH are respectively connected with the first terminal portion 201a and the second terminal 201b portion for heat dissipation, as shown in FIG. 2B and FIG. 2C.

Please note that the first terminal portion 201a and the second terminal 201b portion can be located at a same lateral side of the magnetic body 201B, or the first terminal portion 201a and the second terminal 201b portion can be located at different lateral sides of the magnetic body 201B, or the first terminal portion 201a and the second terminal 201b portion can be disposed on the bottom surface of the magnetic body 201B.

In one embodiment, as shown in FIG. 2B, wherein another thermal conductive layer 209H can be disposed on a corresponding passive electronic device for dissipate heat.

In one embodiment, the third thermal conductive layer 201M further comprises a third terminal portion 201c and a fourth terminal portion 201d, wherein the third terminal portion 201c and the fourth terminal portion 201d are separated by a gap. By doing do, the third thermal conductive layer 201M encapsulating the magnetic body 201B can have at least two terminal portions to electrically connected with the thermal conductive layers such as 207AH, 207BH, 219H to dissipate heat generated from the corresponding electronic devices 207A, 207B, 219 as shown in FIG. 2C.

In one embodiment, as shown in FIG. 2C, metal layers 215, 216, 217 can be disposed on the molding body 210, and the terminal portions, such as the first terminal portion 201a and the second terminal 201b portion, can be electrically connected with the first thermal conductive layer 207AH and the second thermal conductive layer 207BH via the metal layers 215, 216, 217 to dissipate heat generated from the corresponding electronic devices 207A, 207B.

In one embodiment electronic devices 207A, 207B are active devices.

In one embodiment electronic devices 207A, 207B are MOSFET.

In one embodiment, the substrate 205 is a BT (Bismaleimide Triazine) board, metallic substrate or ceramic substrate.

In one embodiment, the first electrode of the magnetic device is electrically connected to a first pin 250, such as a conductive pillar, disposed on the substrate, as shown in FIG. 2A.

In one embodiment, a second electrode of the magnetic device is electrically connected to a second pin 251, such as a conductive pillar disposed on the substrate as shown in FIG. 2A.

In one embodiment, as shown in FIG. 2E, a metal layers 218 can be disposed on the molding body 210 and the terminal portions such as the first terminal portion 201a and the second terminal portion 201c, can be electrically connected with the first thermal conductive layer 207AH and the second thermal conductive layer 207BH via the metal layers 218 to dissipate heat.

In one embodiment, each of the terminal portions 201a, 201b, 201c, 201d is extended inwardly, that is, each of the terminal portions 201a, 201b, 201c, 201d is extended to a bottom surface of the magnetic body 201B. In one embodiment, the electrode 222 of the coil can be located between the first terminal portion 201a and the second terminal portion 201b.

In one embodiment, as shown in FIG. 2D, metal layers 218 and 219 can be disposed on the molding body 210, wherein terminal portion 201b and terminal portion 201d can be electrically connected with the metal layer 218 and terminal portion 201a and terminal portion 201c can be electrically connected with the metal layer 219 to dissipate heat generated from the corresponding electronic devices.

In one embodiment, the third thermal conductive layer 201M comprises a metal layer and the metal layer is attached to the magnetic body 201B by a thermal conductive and adhesive material.

In one embodiment, the third thermal conductive layer 201M comprises a metal plate and the metal plate is attached to the magnetic body 201B by a thermal conductive and adhesive material.

In one embodiment, the third thermal conductive layer 201M comprising metal is electrically connected to a ground for heat dissipation and reducing EMI.

In one embodiment, the third thermal conductive layer 201M encapsulates a top surface and a plurality of lateral surfaces of the magnetic body 201B for heat dissipation.

In one embodiment, the third thermal conductive layer 201M encapsulates a top surface and four lateral surfaces of the magnetic device 201 for heat dissipation.

In one embodiment, the third thermal conductive layer 201M comprises a folded metal plate that encapsulates the top surface and the plurality of lateral surfaces of the magnetic device.

In one embodiment, the third thermal conductive layer 201M is integrally formed.

In one embodiment, at least one portion of the third thermal conductive layer 201M is electroplated on the top surface and the plurality of lateral surfaces of the magnetic device.

In one embodiment, the magnetic device 201 is an inductor.

In one embodiment, the magnetic device 201 is a choke.

Figure 3A:
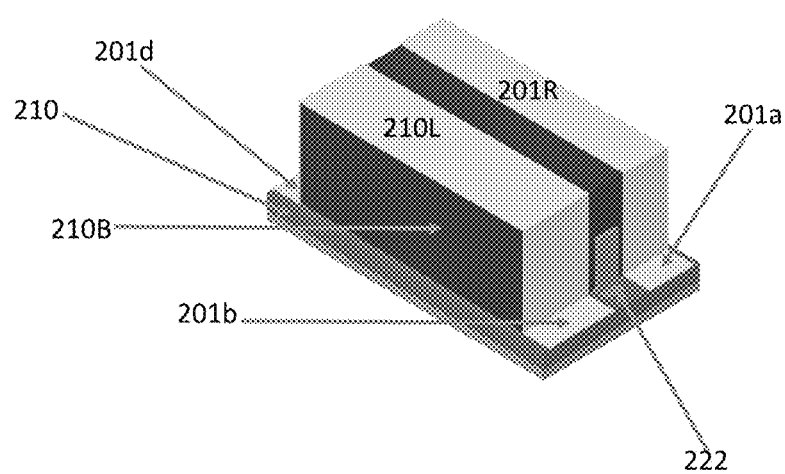
FIG. 3A-3C is a partially schematic of a stacked electronic structure in accordance with one embodiment of the invention.

In one embodiment, the third thermal conductive layer 201M shown in FIG. 2B-2D can be separated into two thermal conductive layers such as two separated metal layer 201L, 201R as shown in FIG. 3A, wherein the metal layer 201L comprises the first terminal portion 201a and the third terminal portion 201c, the metal layer 201R comprises the second terminal portion 201b and the fourth terminal portion 201d, wherein each of the terminal portions 201a, 201b, 201c, 201d is extended outwardly, that is, each of the terminal portions 201a, 201b, 201c, 201d is extended away from the magnetic body 201B.

In one embodiment, the electrode 222 of the coil can be located between the first terminal portion 201a and the second terminal portion 201b.

Figure 3B:
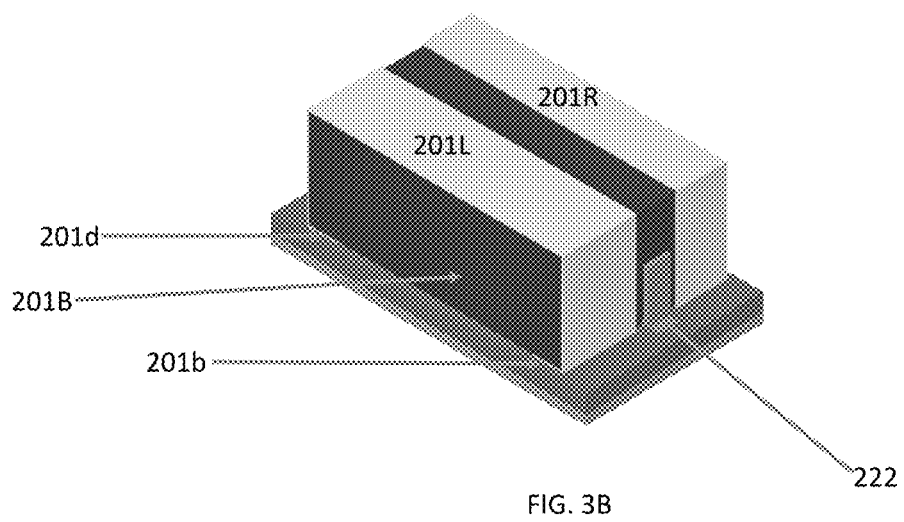

In one embodiment, the third thermal conductive layer 201M shown in FIG. 2B-2D can be separated into two thermal conductive layers such as two separated metal layers 201L, 201R as shown in FIG. 3B, wherein the metal layer 201L comprises the first terminal portion 201a and the third terminal portion 201c, the metal layer 201R comprises the second terminal portion 201b and the fourth terminal portion 201d, wherein each of the terminal portions 201a, 201b, 201c, 201d is extended inwardly, that is, each of the terminal portions 201a, 201b, 201c, 201d is extended to a bottom surface of the magnetic body 201B, wherein the metal layer 201L is extended to the bottom surface through a first lateral surface to a bottom surface of the magnetic body 201B, the metal layer 201R is extended to the bottom surface through the first lateral surface to a bottom surface of the magnetic body 201B, wherein a portion of the electrode of the coil is disposed on the first lateral surface adjacent to the first lateral surface.

Figure 3C:
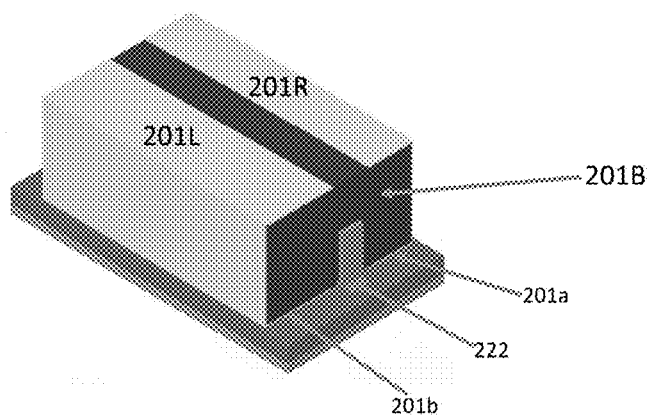

In one embodiment, the third thermal conductive layer 201M shown in FIG. 2B-2D can be separated into two thermal conductive layers such as two separated metal layers 201L, 201R as shown in FIG. 3C, wherein the metal layer 201L comprises the first terminal portion 201a and the third terminal portion 201c, the metal layer 201R comprises the second terminal portion 201b and the fourth terminal portion 201d, wherein each of the terminal portions 201a, 201b, 201c, 201d is extended inwardly, that is, each of the terminal portions 201a, 201b, 201c, 201d is extended to a bottom surface of the magnetic body 201B, wherein the metal layer 201L is extended to the bottom surface through a second lateral surface to a bottom surface of the magnetic body 201B, the metal layer 201R is extended to the bottom surface through a fourth lateral surface to a bottom surface of the magnetic body 201B, wherein the second lateral surface is opposite to the fourth lateral surface, wherein a portion of the electrode of the coil is disposed on the first lateral surface adjacent to the second lateral surface.

In one embodiment, each of the metal layers 201L, 201R comprises a folded metal plate that encapsulates the top surface and the plurality of lateral surfaces of the magnetic device.

In one embodiment, each of the metal layers 201L, 201R is integrally formed.

In one embodiment, at least one portion of each of the metal layers 201L, 201R is electroplated on the top surface and the plurality of lateral surfaces of the magnetic device.

In one embodiment, each of the metal layers 201L, 201R is connected to a ground for dissipating heat and reducing EMI.

For example, as shown in FIG. 4, the thermal resistance of a MOSFET in a conventional electronic module without heat dissipation metal layer is 12.07, which can be reduced to 4.84 by using the stacked electronic module having the metal layers 201L, 201R.

Figure 5A:
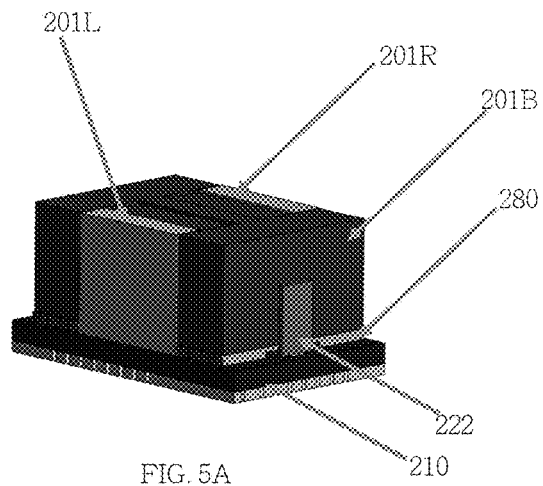
FIG. 5A shows a top view of a magnetic device in accordance with an embodiment of the invention.
Figure 5B:
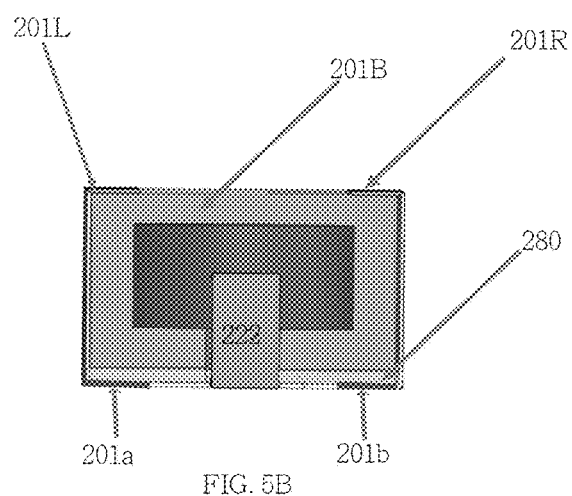
FIG. 5B shows a bottom view of the magnetic device in FIG. 5A in accordance with an embodiment of the invention.

In one embodiment, as shown in FIG. 5A, an insulating layer 280, such as an insulating layer sheet, can be disposed on the bottom surface of the magnetic body 201B for preventing short circuits occur between the magnetic body and the module 210, wherein the metal layer 201L comprises the first terminal portion 201a, and the metal layer 201R comprises the second terminal portion 201b, the terminal portion 201a, 201b can be disposed on the bottom surface of the insulating layer 280, as shown in FIG. 5B, wherein each of the terminal portions 201a, 201b is extended inwardly, that is, each of the terminal portions 201a, 201b is extended to a bottom surface of the magnetic body 201B, wherein the metal layer 201L is extended to the bottom surface through a second lateral surface to a bottom surface of the magnetic body 201B, the metal layer 201R is extended to the bottom surface through a fourth lateral surface to a bottom surface of the magnetic body 201B, wherein the second lateral surface is opposite to the fourth lateral surface, wherein a portion of the electrode 222 of the magnetic device is disposed on the first lateral surface adjacent to the second lateral surface.

Figure 5C:
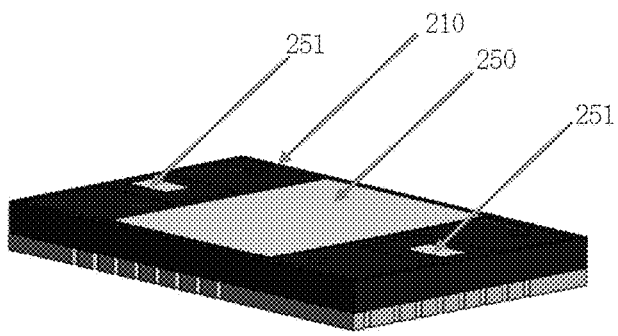
FIG. 5C shows a top view of the module in FIG. 5A in accordance with an embodiment of the invention.

In one embodiment, a bottom surface of the insulating layer sheet 280 is aligned with a bottom surface of the first terminal portion 201a and a bottom surface of the second terminal portion 201b, so as to from a substantially flat surface for mounting the magnetic device on the module 210, wherein the first terminal portion 201a and the second terminal portion 201b can be electrically connected to a pad 250 on a top surface of the module 210, and the electrode 222 of the magnetic device, such as an inductor, can be electrically connected to a pad 251 on a top surface of the module 210, as shown on FIG. 5C.

Figure 6A:
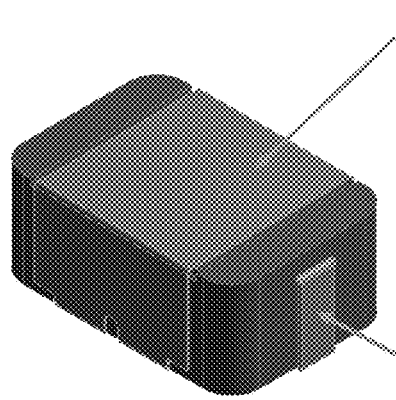
FIG. 6A shows a top view of a magnetic device in accordance with an embodiment of the invention.

In one embodiment, as shown in FIG. 6A, the metal layer 201M comprises a first terminal portion 201a and a second terminal portion 201b, wherein each of the terminal portions 201a, 201b is extended inwardly, that is, each of the terminal portions 201a, 201b is extended to a bottom surface of the magnetic body 201B, wherein the metal layer 201M is extended to the bottom surface through a second lateral surface and a fourth lateral surface of the magnetic body 201B, wherein the second lateral surface is opposite to the fourth lateral surface, wherein a portion of the electrode of the magnetic device, such as an inductor, is disposed on the first lateral surface adjacent to the second lateral surface.

Figure 6B:
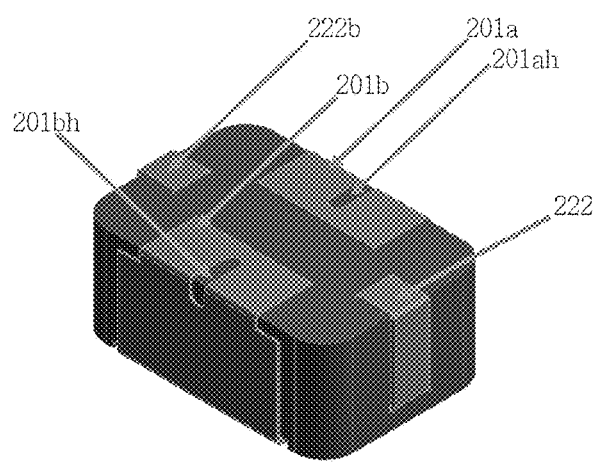
FIG. 6B shows a bottom view of the magnetic device of FIG. 6A in accordance with an embodiment of the invention.

In one embodiment, as shown in FIG. 6B, the metal layer 201M comprises a first opening 201ah that is formed in the terminal portion 201a and extended to the second surface of the magnetic body 201B and a second opening 201bh that is formed in the terminal portion 201b and extended to the fourth surface of the magnetic body 201B, so that the soldering material can be disposed in the openings 201ah, 201bh for making the connectivity between the magnetic device, such as an inductor, and the module 210 more reliable.

Figure 6C:
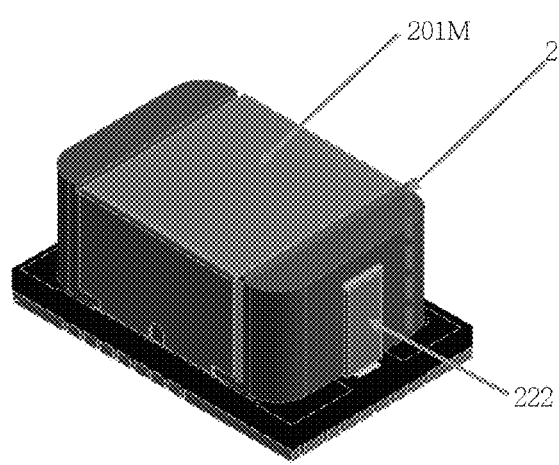
FIG. 6C shows a top view of a magnetic device in accordance with an embodiment of the invention.

In one embodiment, as shown in FIG. 6C, an insulating layer 290 can be disposed on the top surface of the magnetic body 201B and the metal layer 201M can be disposed on the insulating layer 290. In one embodiment, the insulating layer 290 is a mylar sheet.

FIG. 7A shows the heat distribution of the module 210 based on a thermal simulation result without a heat sink for dissipating heat from the module 210; FIG. 7B shows the heat distribution of the module 210 based on a thermal simulation result with the heat-sink structure of the present invention for dissipating heat from the module 210, wherein the levels of the heat generated from components or areas of the module 210 is shown by the colors in FIG. 7C. The simulation results show that, with the heat-sink structure of the present invention for dissipating heat from the module 210, the maximum temperature is 52.925 (° C.) and the maximum thermal resistance is 8.514 (K/W) compared with the maximum temperature: 98.061 (° C.) and the maximum thermal resistance: 22.439 (K/W) without the heat sink for dissipating heat from the module 210, as shown in FIG. 7D.

From the foregoing, it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

What is claimed is:

1. A magnetic device, comprising:
   a magnetic body, comprising a T-core and a unitary molding body, wherein the T-core comprises a base and a pillar that is disposed on a top surface of the base;
   a coil, disposed in the magnetic body and wound around the pillar of the T-core, wherein the unitary molding body encapsulates the pillar of the T-core and the coil with a first portion of the unitary molding body covering a top surface of the pillar and a top surface of the coil and a second portion of the unitary molding body being in contact with an outer lateral surface of the coil; and
   at least one thermal conductive layer, wherein a first portion of the at least one thermal conductive layer encapsulates at least one portion of the coil and a second portion of the at least one thermal conductive layer is exposed from the magnetic body, wherein said first portion of the at least one thermal conductive layer comprises a portion that is disposed between an inner side surface of the coil and a side surface of the pillar of the T-core, and the at least one thermal conductive layer forms a continuous thermal conductive path from the coil to the outside of the magnetic body for dissipating heat generated from the coil.

2. The magnetic device as claimed in claim 1, wherein the magnetic device is an inductor.

3. The magnetic device as claimed in claim 1, wherein the magnetic device is a choke.

4. The magnetic device as claimed in claim 1, wherein the at least one thermal conductive layer has a thermal conductivity: K>0.5 W/mK.

5. The magnetic device as claimed in claim 1, wherein the at least one thermal conductive layer is selected from one of the following materials: copper foil, thermal paste, thermal glue, thermal tape, copper pillar, and graphite.

* * * * *